(12) United States Patent
Honkura et al.

(10) Patent No.: US 8,455,962 B2
(45) Date of Patent: Jun. 4, 2013

(54) MAGNETO-IMPEDANCE SENSOR ELEMENT

(75) Inventors: Yoshinobu Honkura, Tokai (JP);
Michiharu Yamamoto, Tokai (JP);
Katsuhiko Nishihata, Tokai (JP)

(73) Assignee: Aichi Steel Corporation, Tokai-shi (JP)

( * ) Notice: Subject to any disclaimer, the term of this patent is extended or adjusted under 35 U.S.C. 154(b) by 53 days.

(21) Appl. No.: 12/997,290

(22) PCT Filed: Jun. 9, 2009

(86) PCT No.: PCT/JP2009/060517
§ 371 (c)(1),
(2), (4) Date: Dec. 10, 2010

(87) PCT Pub. No.: WO2009/151047
PCT Pub. Date: Dec. 17, 2009

(65) Prior Publication Data
US 2011/0089512 A1 Apr. 21, 2011

(30) Foreign Application Priority Data
Jun. 10, 2008 (JP) .................................. 2008-151537

(51) Int. Cl.
*H01L 27/14* (2006.01)
*G01R 33/02* (2006.01)

(52) U.S. Cl.
USPC .................... 257/414; 257/E29.323; 324/249

(58) Field of Classification Search
USPC ................. 257/414, 427, 423, E43.004, 531, 257/E27.005–E27.007, E29.323; 324/249, 324/253
See application file for complete search history.

(56) References Cited

U.S. PATENT DOCUMENTS

| 6,194,897 | B1 * | 2/2001 | Fukunaga | 324/255 |
| 6,229,307 | B1 * | 5/2001 | Umehara et al. | 324/249 |
| 6,879,153 | B2 * | 4/2005 | Kudo et al. | 324/260 |
| 7,041,526 | B2 * | 5/2006 | Shim et al. | 438/48 |
| 7,304,475 | B2 * | 12/2007 | Kautz | 324/244 |
| 7,535,221 | B2 * | 5/2009 | Satoh | 324/253 |

(Continued)

FOREIGN PATENT DOCUMENTS

| CN | 1513119 A | 7/2004 |
| CN | 1697962 A | 11/2005 |

(Continued)

OTHER PUBLICATIONS

U.S. Appl. No. 13/147,385, filed Aug. 2, 2011, Honkura, et al.

(Continued)

*Primary Examiner* — Matthew Landau
*Assistant Examiner* — Latanya N Crawford
(74) *Attorney, Agent, or Firm* — Oblon, Spivak, McClelland, Maier & Neustadt, L.L.P.

(57) ABSTRACT

A magneto-impedance sensor element has a base body, a magnetic amorphous wire, a coating insulator, a detecting coil, a terminal base having a terminal mounting surface, wire electrode terminals and coil electrode terminals formed on the terminal mounting surface, wire connecting wirings for electrically connecting the wire electrode terminals and a pair of wire conducting terminals provided to the magnetic amorphous wire, and coil connecting wirings for electrically connecting the coil electrode terminals and a pair of coil conducting terminals provided to the detecting coil. A normal of the terminal mounting surface has a longitudinal direction component of the magnetic amorphous wire, and the terminal mounting surface is arranged between both ends of the magnetic amorphous wire in the longitudinal direction of the magnetic amorphous wire.

7 Claims, 11 Drawing Sheets

U.S. PATENT DOCUMENTS

| | | | |
|---|---|---|---|
| 2004/0201374 A1* | 10/2004 | Kawase | 324/117 R |
| 2005/0077585 A1 | 4/2005 | Park et al. | |
| 2005/0242805 A1 | 11/2005 | Honkura et al. | |
| 2006/0033490 A1* | 2/2006 | Joisten et al. | 324/249 |
| 2006/0180910 A1* | 8/2006 | Miyazawa | 257/685 |
| 2006/0202690 A1* | 9/2006 | Park et al. | 324/249 |

FOREIGN PATENT DOCUMENTS

| | | |
|---|---|---|
| JP | 7 27641 | 1/1995 |
| JP | 9 61455 | 3/1997 |
| KR | 10-0598711 B1 | 7/2006 |
| KR | 10-0743384 B1 | 7/2007 |
| WO | 2005 008268 | 1/2005 |

OTHER PUBLICATIONS

International Search Report Issued Aug. 25, 2009 in PCT/JP09/060517 fled Jun. 9, 2009.

Korean Office Action issued Mar. 23, 2012 in patent application No. 10-2011-7000206 with English translation.

Office Action issued Dec. 5, 2012 in Chinese Patent Application No. 200980122231.7 (with English Translation).

* cited by examiner

MAGNETO-IMPEDANCE SENSOR ELEMENT

TECHNICAL FIELD

The present invention relates to a magneto-impedance sensor element using a magnetic amorphous wire whose properties change according to an external magnetic field.

BACKGROUND ART

As sensor elements to be used for magnetic direction sensors or the like, magneto-impedance sensor elements using magnetic amorphous wires whose properties change according to an external magnetic field (hereinafter, "MI sensor elements") has been developed (see Patent Document 1).

Such an MI sensor element has a base body composed of a nonmagnetic body, a magnetic amorphous wire held onto the base body, a coating insulator through which the magnetic amorphous wire passes, and a detecting coil formed around the coating insulator.

Since the MI sensor element having such a constitution is mounted to portable terminal devices such as cellular phones, size-reduction of the MI sensor element is demanded according to size-reduction and thickness-reduction of such devices.
Patent Document 1: International Publication No. 2005/008268

DISCLOSURE OF THE INVENTION

Problem to be Solved by the Invention

However, in order to secure sensitivity of the MI sensor element, the magnetic amorphous wire is required to have certain degree of length.

That is, the longer the length of the amorphous wire is, the smaller an internally-generated demagnetizing field becomes. As a consequence, an influence of the demagnetizing field can be inhibited, and thus an output from the MI sensor element can be easily increased. Further, as the length of the magnetic amorphous wire is made to be longer, a number of turns of the detecting coil formed around the magnetic amorphous wire via the coating insulator can be increased, so that the output from the MI sensor element can be increased.

Therefore, a technique that enables the magnetic amorphous wire to be as long as possible and simultaneously enables the size-reduction of the entire MI sensor element has been desired.

When the MI sensor element is packaged to an IC chip or an IC substrate to which the IC chip is installed, a longitudinal direction of the magnetic amorphous wire may be made to conform to a normal direction of a main surface of the IC chip and the IC substrate (Z axial direction). Particularly in this case, when the length of the magnetic amorphous wire is increased, the MI sensor element becomes larger in a thickness direction of the IC chip. For this reason, when the IC chip to which the MI sensor element is packaged is incorporated into the portable terminal devices, the thinning of the devices becomes difficult.

For this reason, it is ideal that the length of the magnetic amorphous wire is preferably equivalent to the entire length of the MI sensor element in the longitudinal direction.

However, in the conventional MI sensor elements for the Z axis, it is difficult to make equal the length of the magnetic amorphous wire equal to the entire length of the MI sensor element, due to a manufacturing reason.

That is, in order to manufacture the MI sensor element, after the magnetic amorphous wire and the detecting coil are formed on a base body wafer serving as a base material of the base body of many MI sensor elements, the wafer is cut so that individual MI sensors are obtained (see FIGS. 5 and 6 in a first embodiment). An electrode terminal or the like is not basically formed on the cut surface as a pattern. To form the pattern on the cut surface means to form the pattern on the respective MI sensor elements after cutting, and this is not realistic from a viewpoint of productivity. If the pattern is formed on the respective MI sensors, the productivity is reduced significantly as compared with the case where the pattern is formed on the base body wafers.

When the MI sensor element for Z axis shown in FIG. 8 in the Patent Document 1 is observed, electrode terminals that are electrically connected to the magnetic amorphous wire and the detecting coil are seemed to be formed on an upper surface of the base body which is the cut surface, but actually the portion where the electrode terminals are formed is a stepped portion that is one step down from the upper surface of the base body (see a comparative example to be described later). Since this stepped portion is a portion other than the main section of the invention in the Patent Document, it is omitted in this drawing.

That is, in order to form the electrode terminals all at once on the base body wafer before cutting, a groove is formed on a position of the base body wafer corresponding to a side of the base body perpendicular to the magnetic amorphous wire. The electrode terminals are formed on a part of this groove by using sputtering, plating or the like. Thereafter, the base body wafer is cut by a dicing saw or the like so that the electrode terminals formed on the part of the groove are not chipped, and the individual MI sensor elements are obtained. As a result, the part of the groove remains and thus the stepped portion is formed.

As a result, since the MI sensor element cannot be allowed to protrude from the base body to the longitudinal direction, its one end portion is arranged on an inner side of the base body with respect to the stepped portion. For this reason, the length of the magnetic amorphous wire should be shorter than the length of the base body by at least a height of the stepped portion, and thus the sensitivity of the MI sensor element is reduced.

When the above groove is provided to the base body, a groove machining step is required. For this reason, the manufacturing cost increases, and thus improvement of the productivity becomes difficult.

Further, when the groove is formed, the thickness should be increased in order to secure strength of the base body, and thus the sizes-reduction of the MI sensor becomes difficult. When the groove is machined, a material with comparatively low strength is used for the base body in order to facilitate the cutting work. As a result, the thickness of the base body should be increased accordingly, and thus the sizes-reduction of the MI sensor element becomes more difficult.

When the electrode terminals are formed on the same surface of the base body as the magnetic amorphous wire is formed, the above problem does not arise. However, when a magnetically sensitive direction of the MI sensor element is a direction (Z axial direction) perpendicular to the IC chip, the electrode terminals are not provided to this surface. This is because the electrode terminals should be subject to a process such as wire bonding between them and the electrode terminals on the IC chip, and thus the surface where the IC chip is formed should be basically parallel with the surface where the electrode terminals are formed. On the contrary, when the normal MI sensor element having the electrode terminals formed on the surface of the base body which is provided with the magnetic amorphous wire is simply made to rise perpendicularly to the IC chip, the surface provided with the electrode terminals is perpendicular to the IC chip. For this reason, the wire bonding between the electrode terminals of the MI sensor element and the electrode terminals of the IC chip cannot be performed. Further, it is difficult to solder them to each other.

The present invention is devised from these conventional problems, and its object is to provide a magneto-impedance sensor element that achieves high sensitivity and size-reduction.

Means for Solving the Problems

The present invention is a magneto-impedance sensor element including: a base body made of a nonmagnetic body; a magnetic amorphous wire held onto the base body; a coating insulator formed so that the magnetic amorphous wire passes therethrough; a detecting coil formed around the coating insulator; a terminal base made of an insulator having a terminal mounting surface rising from a front surface of the base body where the magnetic amorphous wire is arranged; wire electrode terminals and coil electrode terminals formed on the terminal mounting surface; wire connecting wirings for electrically connecting the wire electrode terminals and a pair of wire conducting terminals provided to the magnetic amorphous wire; and coil connecting wirings for electrically connecting the coil electrode terminals and a pair of coil conducting terminals provided to the detecting coil, wherein a normal of the terminal mounting surface has a longitudinal direction component of the magnetic amorphous wire, and the terminal mounting surface is arranged between both ends of the magnetic amorphous wire in the longitudinal direction of the magnetic amorphous wire.

An operational effect of the present invention is described below.

The magneto-impedance sensor element (MI sensor element) has the terminal base having the terminal mounting surface. The terminal mounting surface is arranged between the both ends of the magnetic amorphous wire in the longitudinal direction of the magnetic amorphous wire. As a result, the wire electrode terminals and the coil electrode terminals can be easily formed on the terminal mounting surface of the terminal base, and the magnetic amorphous wire can be disposed over the base body in the longitudinal direction of the magnetic amorphous wire. As a result, the magnetic amorphous wire can be lengthened without increasing a size of the base body, and the sensitivity can be heightened without enlarging the MI sensor element.

That is, when the MI sensor element is manufactured, in general the magnetic amorphous wire, and the detecting coil and the like are formed on a base body wafer serving as a basic material of the base bodies of many MI sensor elements, and the wafer is cut to obtain individual MI sensor elements. At this time, when the MI sensor elements have the terminal base, the wire electrode terminals and the coil electrode terminals can be easily formed before the individual MI sensor elements are obtained by the cutting.

Since the MI sensor element has the terminal base, the groove (stepped portion) does not have to be formed on the base body wafer. For this reason, a problem that the length of the magnetic amorphous wire should be shortened as a stepped portion is formed does not arise, thereby preventing a defect such that the length of the magnetic amorphous wire becomes short with respect to the size of the base body. For this reason, the length of the magnetic amorphous wire can be made to be equivalent to the entire length of the MI sensor element, and thus both the size-reduction and the high sensitivity of the MI sensor element can be achieved.

Since the groove machining step is not necessary, the manufacturing cost can be reduced, and the productivity can be improved.

Further, since a groove does not have to be formed, the thickness of the base body does not particularly have to be increased, and the size-reduction of the MI sensor element becomes easy. Since the facilitating of the cutting work does not particularly have to be considered, a material with high strength can be used as the base body, and accordingly the thickness of the base body can be further decreased, thereby further facilitating the size-reduction of the MI sensor element.

As mentioned above, according to the present invention, the magneto-impedance sensor element that achieves high sensitivity and size-reduction can be provided.

BEST MODE FOR CARRYING OUT THE INVENTION

Figure 1:
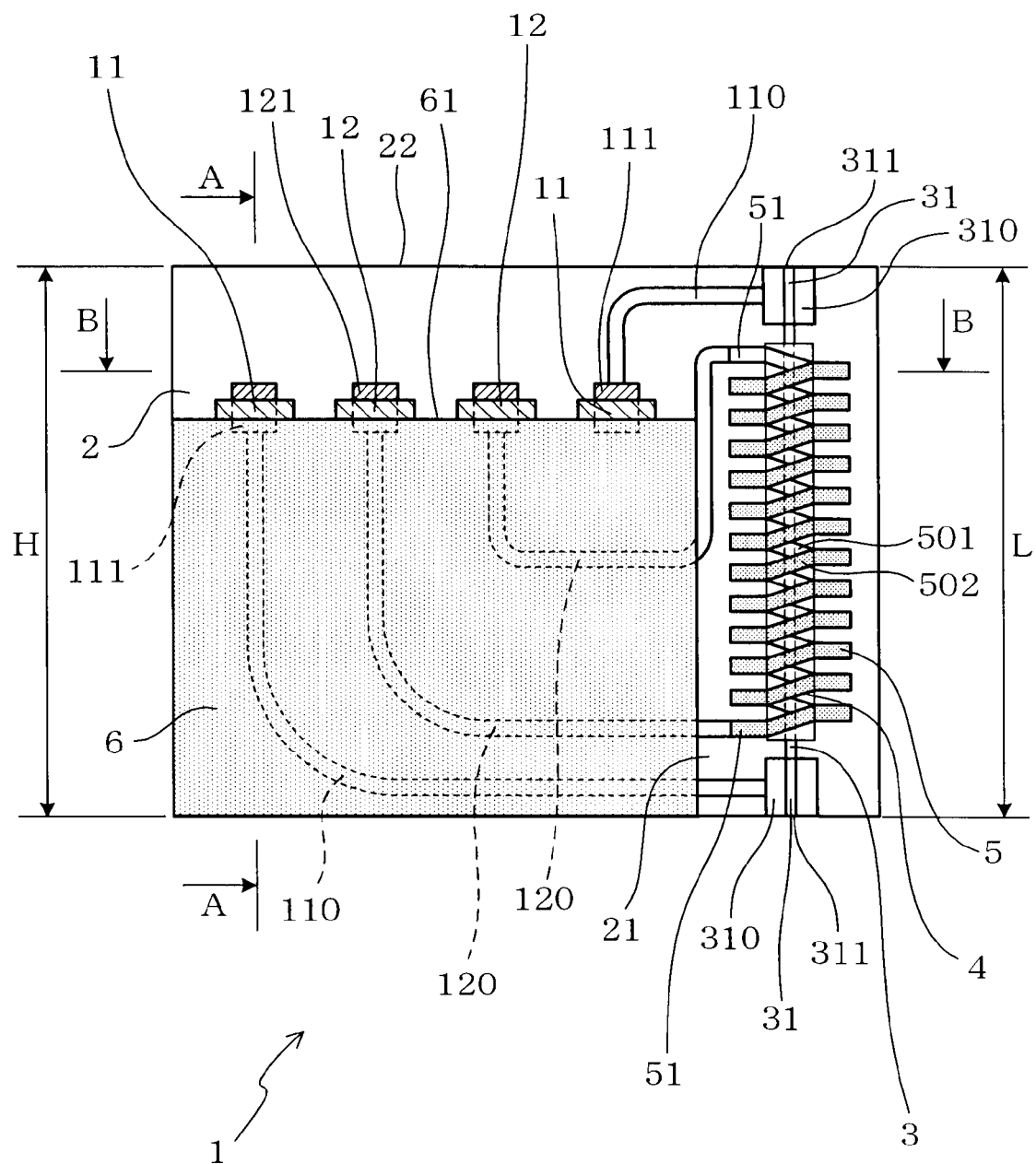
FIG. 1 is an elevational view illustrating an MI sensor element according to a first embodiment.

In the present invention, a terminal mounting surface is preferably formed so that its normal is conformed to a longitudinal direction of a magnetic amorphous wire.

In this case, in order to package an MI sensor element to an IC chip or the like, the magnetic amorphous wire is arranged so as to be perpendicular to a main surface of the IC chip, wire electrode terminals and coil electrode terminals can be made to be parallel with the main surface of the IC chip. As a result, the wire electrode terminals and the coil electrode terminals can be easily electrically connected with the IC chip by wire bonding or the like.

It is preferable that the terminal base is formed on an area other than the area where the magnetic amorphous wire, a coating insulator and a detecting coil are formed.

In this case, since the terminal base does not cover the magnetic amorphous wire, the coating insulator and the detecting coil, a stress to be applied to the magnetic amorphous wire, dew condensation on the magnetic amorphous wire and the like are prevented, and accurate detection of a magnetic field can be secured.

If the terminal base is disposed so as to cover the magnetic amorphous wire, a stress might be applied to the magnetic amorphous wire, and a parasitic capacitance might be changed by the dew condensation or the like of air present between the magnetic amorphous wire and the terminal base. An electric current to be supplied to the magnetic amorphous wire fluctuates due to the stress and the change in the parasitic capacitance, and magnetic sensitivity of the MI sensor element (output/applied magnetic field) might vary (for example, the magnetic sensitivity might vary by about 10%). For this reason, the terminal base is provided so as not to cover the magnetic amorphous wire, thereby avoiding such a defect. That is, the variation of the magnetic sensitivity of the MI sensor element can be mostly eliminated (for example, the variation in the magnetic sensitivity is less than 1%).

In order to solve the problem of the stress and the problem of the parasitic capacitance, it can be considered that a linear expansion coefficient, an adhesive force and a dielectric constant of an insulating material composing the terminal base are set to suitable values. In this case, however, freedom to choose the material is noticeably limited. Such a problem can be solved by the invention as recited in claim 3.

It is preferable that the element is packaged to an IC chip formed by an electronic circuit so that a longitudinal direction of the magnetic amorphous wire is conformed to a normal direction of a main surface of the IC chip.

When the normals of the wire electrode terminals and the coil electrode terminals do not have the same direction component as the longitudinal direction component of the magnetic amorphous wire, it is difficult to connect the electronic circuit formed on the main surface of the IC chip and the terminals. For this reason, it is not desirable that the wire electrode terminals and the coil electrode terminal are provided on the surface of the base body where the magnetic amorphous wire is formed. The wire electrode terminals and the coil electrode terminals are formed on a surface that is at a certain angle or, more preferably, perpendicular to the surface formed with the magnetic amorphous wire is formed.

Therefore, the present invention is applied to such an MI sensor element so that the operational effect can be sufficiently exerted.

The packaging of the MI sensor element to the IC chip includes direct electric connection of the MI sensor element to the IC chip by means of wire bonding or the like, and also indirect electric connection of the IC chip to the MI sensor element via an IC substrate on which the IC chip is installed.

The element may be packaged to the IC substrate provided with the IC chip mounted thereon with the electronic circuit formed thereon, so that the longitudinal direction of the magnetic amorphous wire is conformed to a normal direction of the main surface of the IC substrate.

When the MI sensor element is electrically connected to the IC chip via the IC substrate provided with the IC chip mounted thereon, the MI sensor element is packaged so that the longitudinal direction of the magnetic amorphous wire is conformed to the normal direction of the main surface of the IC substrate. As a result, the terminals of the electronic circuit formed on the main surface of the IC substrate are easily connected to the wire electrode terminals and the coil electrode terminals. In such a constitution, the working-effect of the present invention can be sufficiently exerted.

EMBODIMENT

First Embodiment

The magneto-impedance sensor element according to a first embodiment of the present invention is described with reference to FIGS. 1 to 6.

Figure 2:
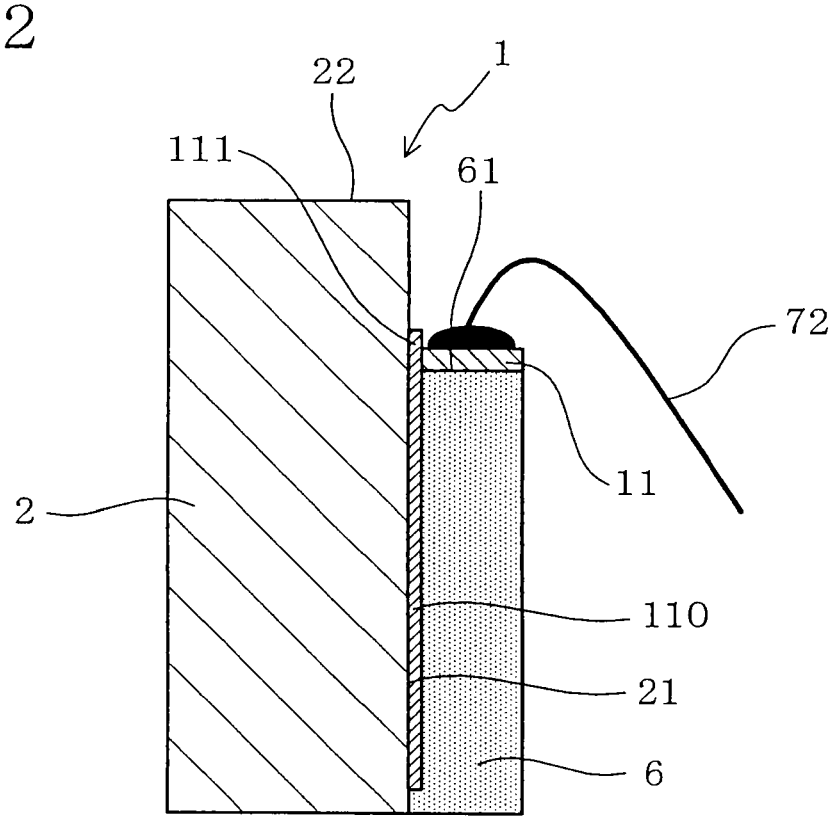
FIG. 2 is a cross-sectional view illustrating the MI sensor element, similar to a cross section in the direction of the arrow A-A in FIG. 1 and also illustrating a state that a bonding wire is connected according to the first embodiment.
Figure 3:
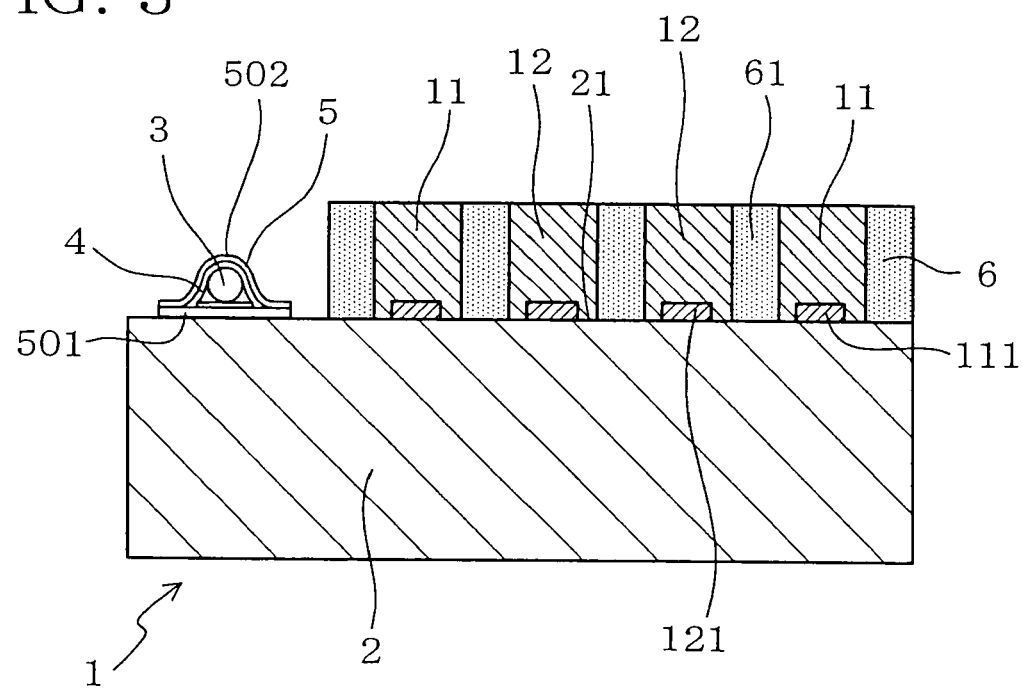
FIG. 3 is a cross-sectional view in a direction of the arrow B-B in FIG. 1.

As shown in FIGS. 1 to 3, a magneto-impedance sensor element (MI sensor element) 1 according to the first embodiment has a base body 2 made of a nonmagnetic body, a magnetic amorphous wire 3 held on the base body 2, a coating insulator 4 formed so that the magnetic amorphous wire 3 passes through its inside, and a detecting coil 5 formed around the coating insulator 4.

A terminal base 6 made of an insulator having a terminal mounting surface 61 rising from a surface 21 is formed on the surface 21 of the base body 2 on which the magnetic amorphous wire 3 is arranged.

A pair of wire electrode terminals 11 and a pair of coil electrode terminals 12 are formed on the terminal mounting surface 61. One of the paired wire electrode terminals 11 and one of the paired coil electrode terminals 12 can share one electrode as a standard potential. In this case, a total number of the wire electrode terminals 11 and the coil electrode terminals 12 can be three.

The wire electrode terminals 11 are electrically connected to a pair of wire conducting terminals 31 provided to the magnetic amorphous wire 3 by wire connecting wirings 110.

The coil electrode terminals 12 are electrically connected to a pair of coil conducting terminals 51 provided to the detecting coil 5 by coil connecting wirings 120.

The normal of the terminal mounting surface 61 has a direction component same as the longitudinal direction component of the magnetic amorphous wire 3, and the terminal mounting surface 61 is arranged between both ends 311, 311 of the magnetic amorphous wire 3 in the longitudinal direction of the magnetic amorphous wire 3.

In the first embodiment, the terminal mounting surface 61 is formed so that its normal is in the longitudinal direction of the magnetic amorphous wire 3.

Further, as shown in FIGS. 1 and 3, the terminal base 6 is formed on an area other than the area where the magnetic amorphous wire 3, the coating insulator 4 and the detecting coil 5 are formed. That is, the terminal base 6 is formed in a position other than the area where the magnetic amorphous wire 3, the coating insulator 4 and the detecting coil 5 are formed so as not to cover them, although the terminal base 6 is formed on the surface of the base body 2 so as to partially cover the wire connecting wirings 110 and the coil connecting wirings 120.

Figure 4:
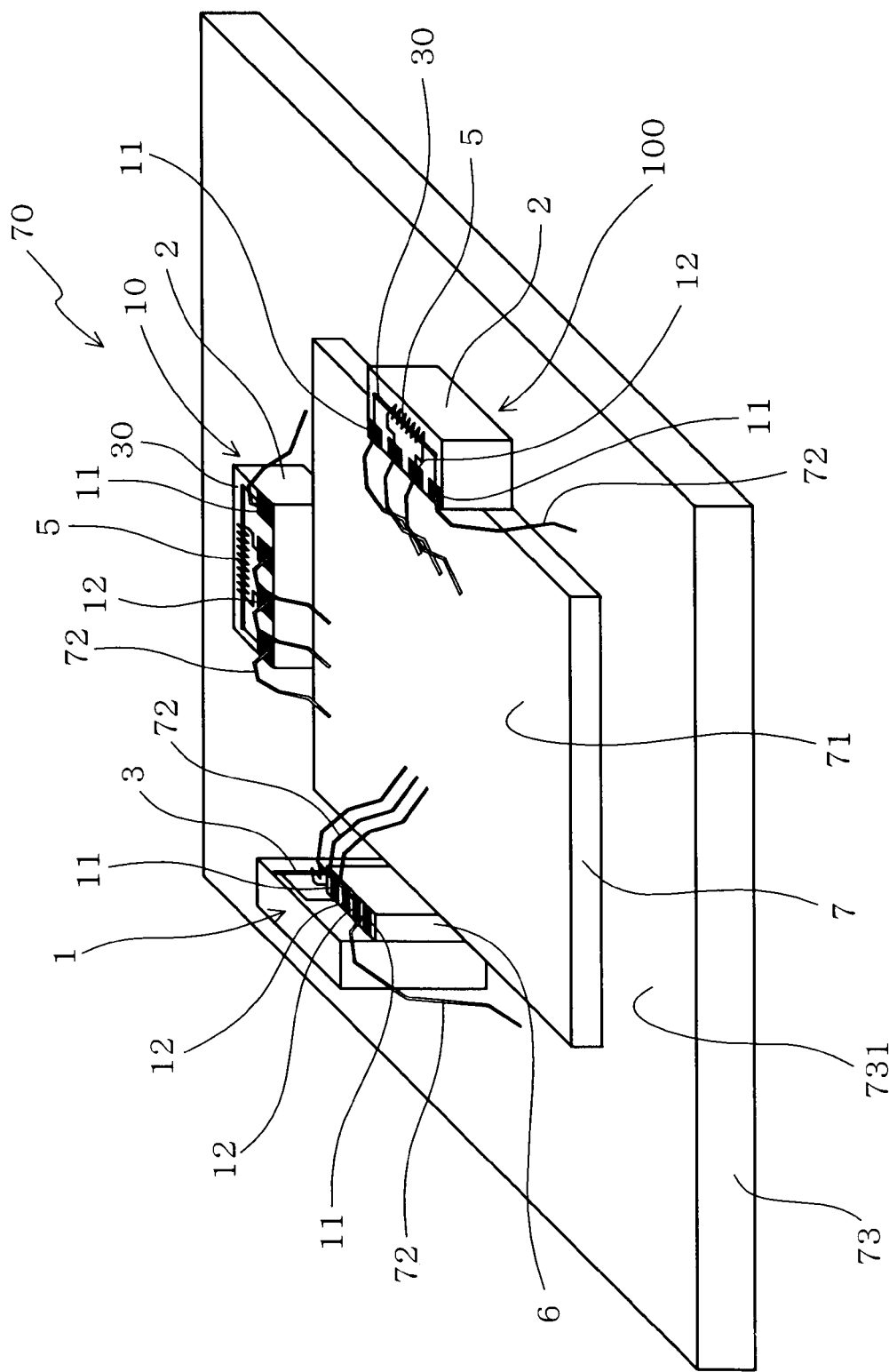
FIG. 4 is a perspective view illustrating a magnetic direction sensor using the MI sensor element according to the first embodiment.

The MI sensor element 1 in the first embodiment is packaged to the IC chip 7 with an electronic circuit formed, so that the longitudinal direction of the magnetic amorphous wire 3 is conformed to the normal direction of a main surface 71 of an IC chip 7 as shown in FIG. 4.

In the MI sensor element 1, a direction perpendicular to the main surface 71 of the IC chip 7 at the time of packing into the IC chip 7 is a Z axial direction. That is, the direction that corresponds to the longitudinal direction of the magnetic amorphous wire 3 is the Z axial direction.

As the base body 2, for example, insulating alumina ceramics, a silicon wafer of a semiconductor, metal of a conductor and the like can be used. A thickness in the direction perpendicular to the main surface 21 can be set to, for example, 0.1 mm to 0.5 mm. In the first embodiment, the thickness is 0.3 mm. A height of the base body 2 in the Z axial direction is 0.6 mm.

The magnetic amorphous wire 3 is made of CoFeSiB alloy of zero magnetostrictive amorphous, and its diameter can be, for example, 20 µm or less. In this embodiment, the diameter is 10 µm. The magnetic amorphous wire 3 is disposed on the surface 21 of the base body 2 over the Z axial direction of the base body 2 as shown in FIG. 1. In this embodiment, a length of the magnetic amorphous wire 3 is 0.6 mm.

Wire conducting terminals 31 on both ends of the magnetic amorphous wire 3 are electrically connected to conducting pads 310 formed on the surface 21 of the base body 2.

A portion of the magnetic amorphous wire 3 between the paired conducting terminals 31 is coated with the coating insulator 4. The coating insulator 4 can be formed by using an inorganic insulating material such as aluminum oxide or silicon oxide or an organic insulating material such as epoxy resin.

The detecting coil 5 is formed on an outer peripheral surface of the coating insulator 4. The detecting coil 5 is disposed so as to be spirally wound around the outer periphery of the coating insulator 4 by suitably connecting a plane pattern 501 deposited on the surface 21 of the base body 2 to a cubic pattern 502 deposited on an outer surface of the coating insulator 4. Both ends of the winding pattern of the detecting coil 5 are coil conducting terminals 51. The number of turns of the detecting coil 5 is 15.

In the first embodiment, the magnetic amorphous wire 3, the coating insulator 4 and the detecting coil 5 are disposed so as to rise from the surface 21 of the base body 2. However, as disclosed in FIG. 2 of Patent Document 1, a groove may be formed on the base body, and the magnetic amorphous wire, the coating insulator and the detection coil may be arranged therein. When such a groove is formed, the thickness of the base body must be increased, and thus it is desirable to adopt the constitution of the first embodiment from a viewpoint of the size-reduction.

One end of each of the coil connecting wirings 120 formed on the surface 21 of the base body 2 is connected to the paired coil conducting terminals 51. One end of each of the wire connecting wirings 110 formed on the surface 21 of the base body 2 is connected to the paired wire conducting terminals 31 via the conducting pads 310.

The other end of each of the wire connecting wirings 110 is connected to the wire electrode terminals 11, and the other end of each of the coil connecting wires 120 is connected to the coil electrode terminals 12.

The terminal base 6 provided to the surface 21 of the base body 2 is made of an insulator such as epoxy resin or ceramic, and is formed so as to cover the wire connecting wirings 110 and the coil connecting wirings 120.

The terminal base 6 is provided with the terminal mounting surface 61, which is a flat surface perpendicular to the Z axis, in a position that retreats sufficiently inside (by, for example, 150 to 550 µm) from one end (upper end 22) of the base body 2 in the Z axial direction. The terminal mounting surface 61 retreats from the upper end 22 by 200 µm.

The paired wire electrode terminals 11 and the paired coil electrode terminals 12 are provided on the terminal mounting surface 61.

In the first embodiment, the terminal base 6 is formed on the entire surface 21 of the base body 2 excluding the area where the magnetic amorphous wire 3, the coating insulator 4 and the detecting coil 5 are formed and an area from the terminal mounting surface 61 to the end surface (upper end 22) of the base body 2 in a direction the terminal mounting surface 61 faces.

A thickness of the terminal base 6, namely, a width of the terminal mounting surface 61 is, for example 80 to 150 µm. In the first embodiment, the width of the terminal mounting surface 61 is 100 µm.

Terminal portions 111 of the wire connecting wirings 110 on the side of the wire electrode terminals 11 are formed to partially protrude from the terminal mounting surface 61 and are connected to the wire electrode terminals 11. Similarly, terminal portions 121 of the coil connecting wirings 120 on the side of the coil electrode terminals 12 are formed so as to partially protrude from the terminal mounting surface 61 and are connected to the coil electrode terminals 12.

As shown in FIG. 4, the MI sensor element 1 is packaged to the IC chip 7 as the element for Z axial direction, and is disposed so that the longitudinal direction of the magnetic amorphous wire 3 is perpendicular to the main surface 71 of the IC chip 7. The IC chip 7 is installed to an IC substrate 73 for connecting a mother board and the IC chip 7, and a main surface 731 of the IC substrate 73 is parallel with the main surface 71 of the IC chip 7. The MI sensor element 1 is installed to the main surface 731 of the IC substrate 73 beside the IC chip 7.

The wire electrode terminals 11 and the coil electrode terminals 12 in the MI sensor element 1 are electrically connected to predetermined terminals in the electronic circuit formed on the main surface 71 of the IC chip 7 or predetermined terminals in the electronic circuit formed on the main surface 731 of the IC substrate 73, respectively, by bonding wires 72. Concretely, both the two coil electrode terminals 12 in the MI sensor element 1 are bonding-connected to the terminals of the IC chip 7, but one of the wire electrode terminals 11 is bonding-connected to the terminal of the IC chip 7 and the other one is bonding-connected to the terminal of the IC substrate 73.

This connecting method is one example. For example, all the wire electrode terminals 11 and the coil electrode terminals 12 in the MI sensor element 1 may be connected to the terminals of the IC chip 7, or may be connected to the terminals of the IC substrate 73.

Further, an MI sensor element 10 for an X axis and an MI sensor element 100 for a Y axis, which has a magnetic amorphous wire 30 in a direction parallel with the main surface 71 of the IC chip 7 and perpendicular to each other, are packaged to the IC chip 7. The MI sensor element 10 for the X axis and the MI sensor element 100 for the Y axis have components approximately similar to those of the MI sensor element 1 for the Z axis of the first embodiment. However, the MI sensor elements 10 and 100 are different from the MI sensor element 1 for the Z axis in that they do not have the terminal base 6 and the wire electrode terminals 11 and the coil electrode terminals 12 are formed on the surface of the base body 2 where the magnetic amorphous wire 30 is provided.

The three MI sensor elements (1, 10 and 100) including the MI sensor element 1 of the first embodiment compose a magnetic direction sensor 70 for detecting a three-dimensional direction utilizing geomagnetism. This geomagnetic direction sensor 70 can be installed to portable terminal devices such as cellular phones.

Here, the MI sensor element 1 for the Z axial direction according to the first embodiment is combined with the MI sensor elements 10 and 100 for the X axis and Y axis, so as to compose the triaxial magnetic direction sensor 70, but the two MI sensor elements including the MI sensor element 1 according to the first embodiment can compose a biaxial magnetic direction sensor.

The MI sensor element 1 according to the first embodiment is not limited to such a magnetic direction sensor, and can be used for a current sensor or the like. In this case, only the one MI sensor element 1 according to the first embodiment is used to compose the sensor.

Figure 5:
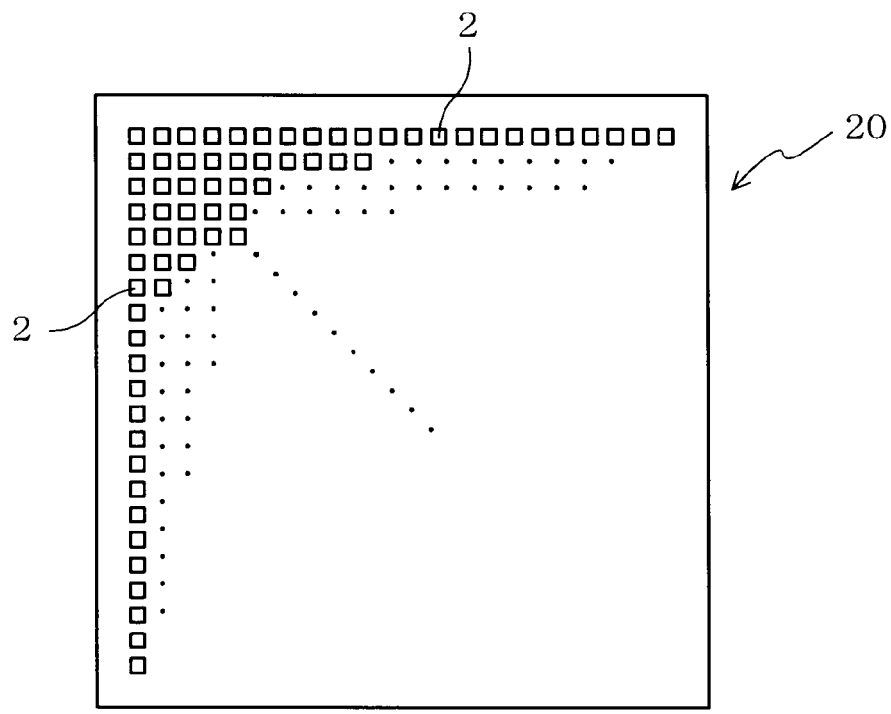
FIG. 5 is a plan view illustrating a base body wafer according to the first embodiment.

When the MI sensor element 1 according to the first embodiment is manufactured, as shown in FIG. 5, the magnetic amorphous wire 3, the detecting coil 5 and the like are formed on a base body wafer 20 serving as the basic material of the base body 2 of the many MI sensor elements 1. That is, the many MI sensor elements 1 (for example, the size of about 1 m or less square) is formed on the large base body wafer 20 of about 10 cm square as a pattern.

At this time, the terminal base 6 is formed on the surface 21 of the base body 2. When the terminal base 6 is formed, photosensitive epoxy resin, for example, can be used. That is, after being applied to the entire surface 21 of the base body 2, the resin is dried and exposed in a state where it is masked so that light is emitted only to a portion where the terminal base 6 is desired to be formed. Development is performed by a developer, so that the terminal base 6 having predetermined size and shape is formed on a predetermined position.

The wire electrode terminals 11 and the coil electrode terminals 12 are deposited on the terminal mounting surface 61 of the terminal base 6 by using sputtering or plating.

Figure 6:
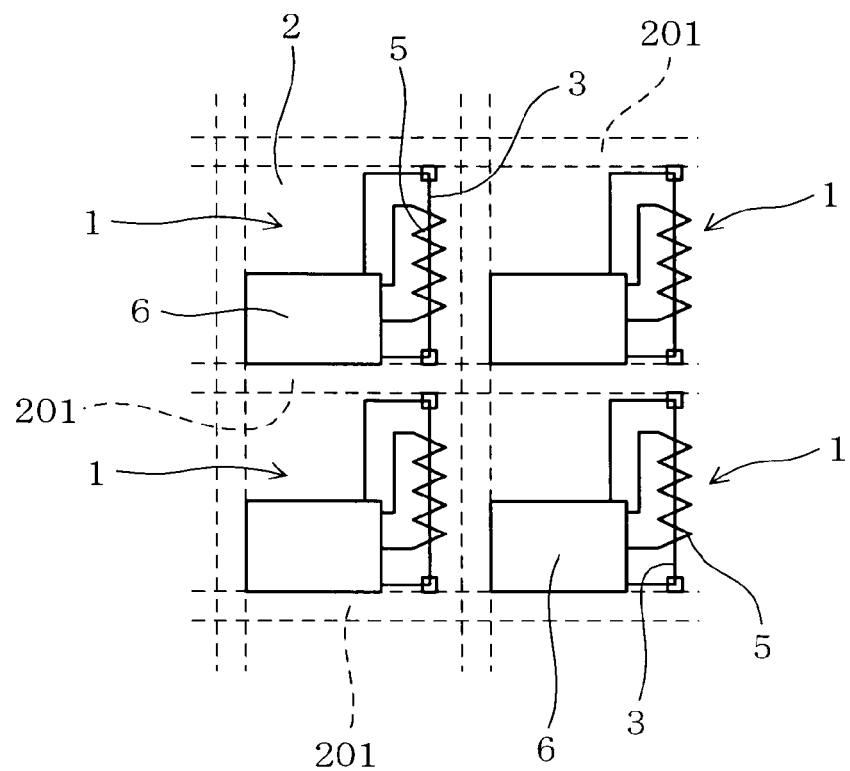
FIG. 6 is a partially enlarged plan view illustrating the base body wafer according to the first embodiment.

Description of a forming method other than the methods for forming the terminal base 6, the wire electrode terminals 11 and the coil electrode terminals 12 is omitted above. After all components of the MI sensor elements 1 are formed, as shown in FIG. 6, the base body wafer 20 is cut by using a dicing saw, so that individual MI sensor elements 1 are obtained. At this time, the cut surface is made to be a desired outline of the MI sensor element 1, taking into account a cutting margin 201 (for example, 200 μm) of the dicing saw.

A working-effect of the first embodiment is described below.

The magneto-impedance sensor element 1 has the terminal base 6 having the terminal mounting surface 61, and the terminal mounting surface 61 is arranged between both ends 311, 311 of the magnetic amorphous wire 3 in the longitudinal direction of the magnetic amorphous wire 3. As a result, the wire electrode terminals 11 and the coil electrode terminals 12 can be easily formed on the terminal mounting surface 61 of the terminal base 6, and the magnetic amorphous wire 3 can be disposed over the entire base body 2 in the longitudinal direction of the magnetic amorphous wire 3. As a result, the magnetic amorphous wire 3 can be lengthened without increasing the size of the base body 2, and the sensitivity can be heightened without enlarging the MI sensor element 1.

That is, when the MI sensor element 1 is manufactured, in general, after the magnetic amorphous wire 3 and the detecting coil 5 are formed on the base body wafer 20, the base body wafer 20 is cut so that individual MI sensor elements 1 are obtained. At this time, since the MI sensor element 1 has the terminal base 6, the wire electrode terminals 11 and the coil electrode terminals 12 can be easily formed before the individual MI sensor elements 1 are obtained by the cutting.

Figure 14A:
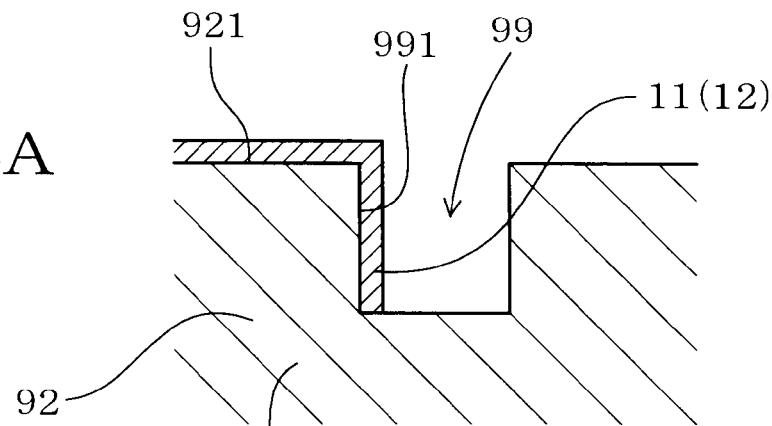
FIG. 14 is a cross-sectional explanatory view illustrating a method for cutting the base body wafer according to the comparative example.

Further, since the MI sensor element 1 has the terminal base 6, the groove described in a comparative example (see reference symbol 99 in FIG. 14(A)) does not have to be formed on the base body wafer 20. For this reason, the length of the magnetic amorphous wire 3 can be made to be equivalent to the entire length of the MI sensor element 1, and both the size-reduction and the high sensitivity of the MI sensor element 1 can be achieved.

Since the groove machining step is not necessary, the manufacturing cost can be reduced, and the productivity can be improved.

Since the groove does not have to be formed, the thickness of the base body 2 does not have to be particularly increased, thereby facilitating the size-reduction of the MI sensor element 1. Further, since the facilitation of the cutting work does not have to be particularly taken into consideration, a material with high strength can be used for the base body 2. Accordingly, the thickness of the base body 2 can be further reduced, and thus the size-reduction of the MI sensor element 1 becomes easier.

The terminal base 6 is formed on the area other than the area where the magnetic amorphous wire 3, the coating insulator 4 and the detecting coil 5 are formed. As a result, the terminal base 6 does not cover the magnetic amorphous wire 3, the coating insulator 4 and the detecting coil 5, thereby preventing the stress from being applied to the magnetic amorphous wire 3 and securing accurate detection of the magnetic field.

According to the first embodiment, the magneto-impedance sensor element that achieves high sensitivity and size-reduction can be provided.

A characteristic evaluation conducted on the MI sensor element 1 according to the first embodiment is described below with reference to FIGS. 7 and 8.

Figure 7:
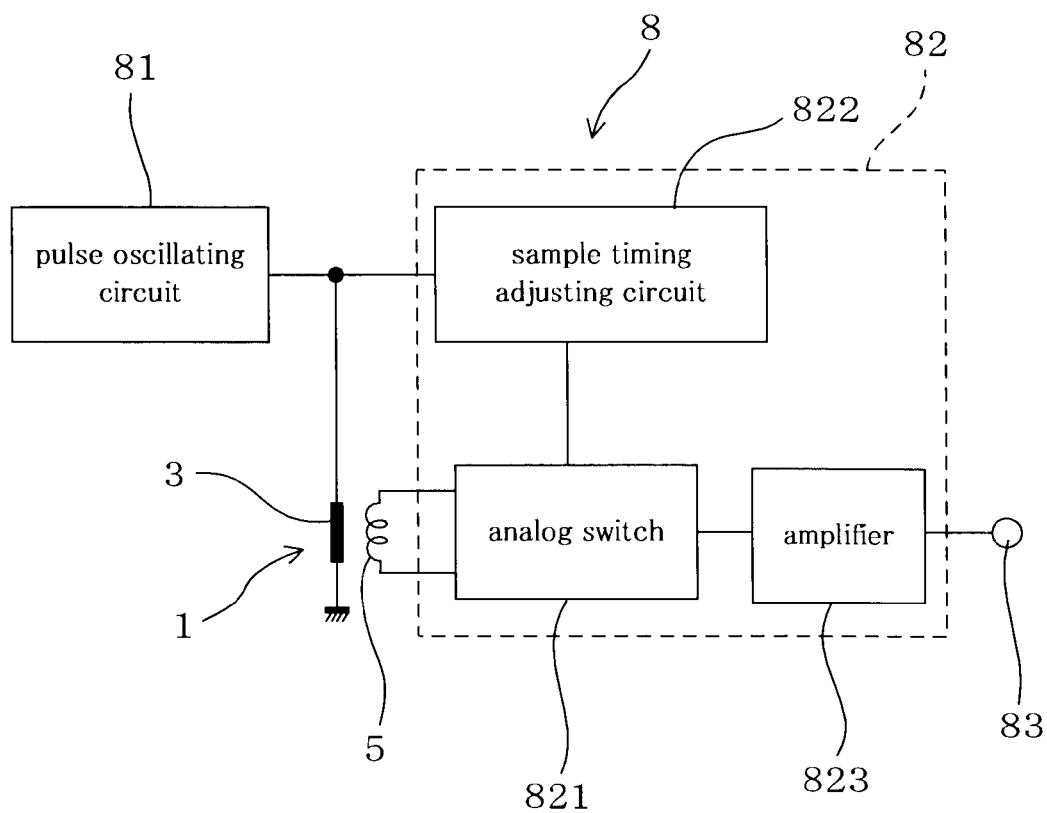
FIG. 7 is a conceptual explanatory diagram illustrating an electronic circuit according to the first embodiment.

That is, the MI sensor element 1 is incorporated into an electronic circuit 8 shown in FIG. 7, and the following magnetic sensing evaluation was conducted.

The electronic circuit 8 has a pulse oscillating circuit 81 for oscillating a pulse signal to be input into the magnetic amorphous wire 3 of the MI sensor element 1, and a signal processing circuit 82 for processing a detection voltage generated on the detecting coil 5 of the MI sensor element 1. The signal processing circuit 82 has an analog switch 821 for switching between the detecting coil 5 and an output terminal 83, a sample timing adjusting circuit 822 for turning on/off the analog switch 821 in conjunction with a pulse signal, and an amplifier 823 for amplifying an inductive voltage generated on the detecting coil 5.

The pulse oscillating circuit 81 generates a pulse signal mainly including 200 MHz, whose intensity is 170 mA and whose signal interval is 1 μsec, and inputs this pulse signal into the magnetic amorphous wire 3. As to this pulse current, a cutoff time at which the pulse current falls from 90% of a steady state value to 10% is set to 4 nanoseconds. As a result, the inductive voltage according to a magnetic field in the longitudinal direction (Z axial direction) of the magnetic amorphous wire 3 is generated on the detecting coil 5 of the MI sensor element 1 at the time of falling of the pulse signal. This inductive voltage is amplified by the amplifier 823 via the analog switch 821 so as to be outputted from the output terminal 83.

While the MI sensor element 1 is being rotated around a horizontal axis by 360° using the electronic circuit 8, its output characteristic is evaluated.

At first, a state that the longitudinal direction (Z axial direction) of the magnetic amorphous wire 3 of the MI sensor element 1 is conformed to a vertical direction is defined as being a rotation angle of 0°, and the intensity of the output signal of the MI sensor element 1 is 0 mV. The MI sensor element 1 is rotated around the horizontal axis by 360°. A change in the output signal at this time is shown in FIG. 8.

Figure 8:
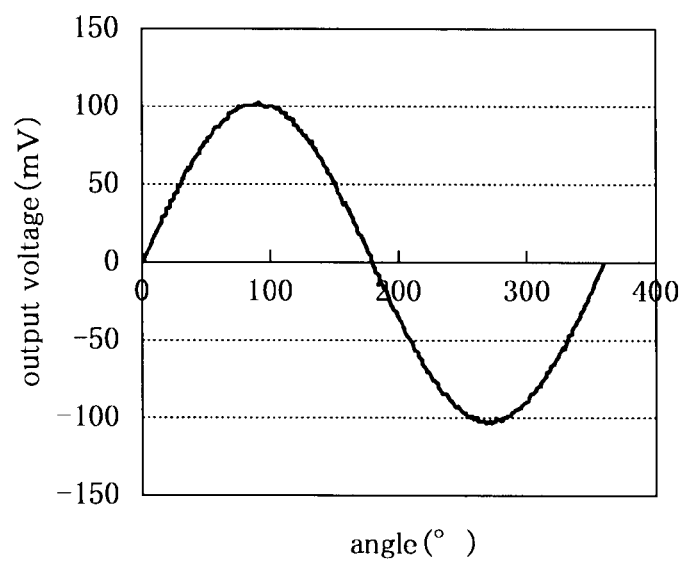
FIG. 8 is a diagrammatic view illustrating a measured result of an output voltage according to a first embodiment.

As is clear from FIG. 8, the output signal draws a beautiful sine curve, and a component of the Z axial direction of geomagnetism is accurately detected. As a result, it is found that the MI sensor element 1 in the first embodiment can secure sufficient detecting accuracy even if its size is reduced.

Second Embodiment

Figure 9:
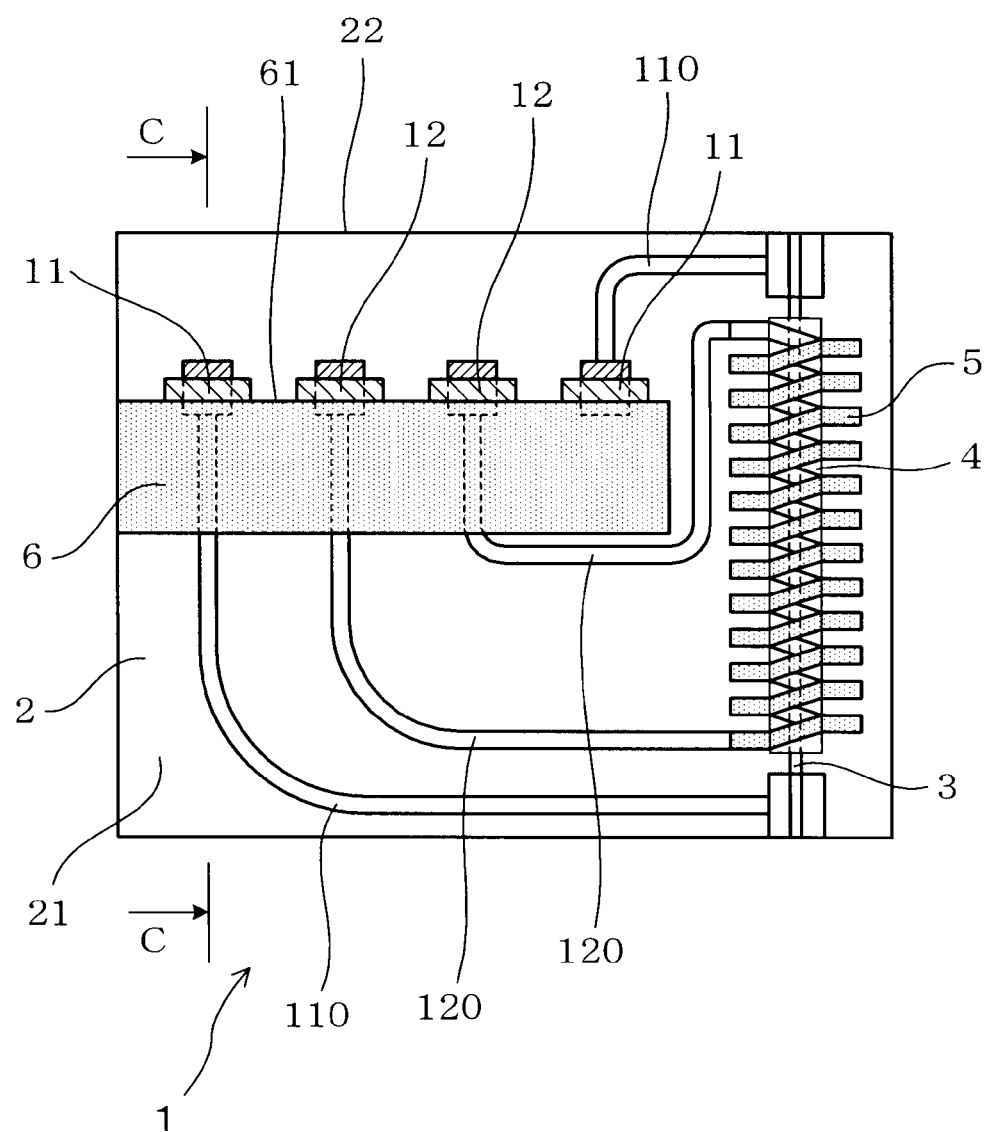
FIG. 9 is an elevational view illustrating the MI sensor element according to a second embodiment.
Figure 10:
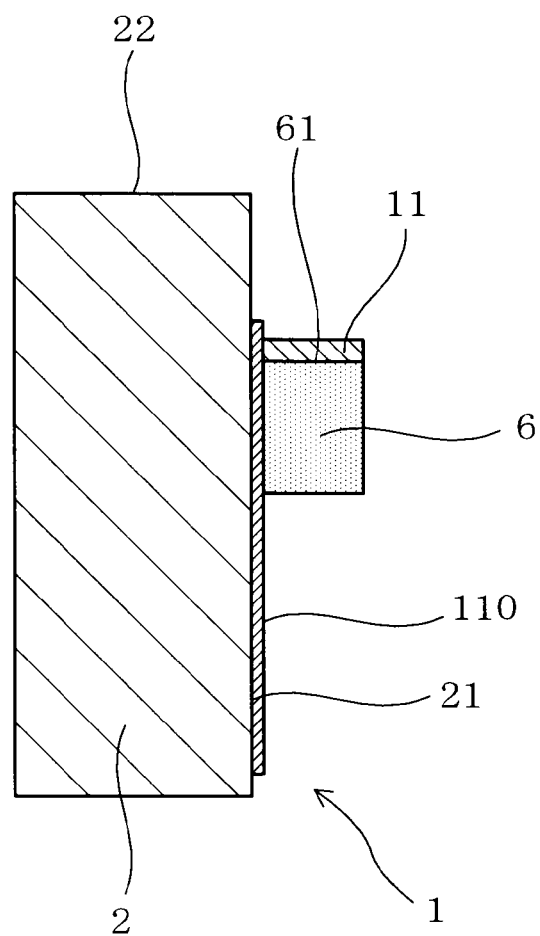
FIG. 10 is a cross-sectional view in the direction of the arrow C-C in FIG. 9.

A second embodiment is an example where the size of the terminal base 6 is reduced in comparison with the first embodiment as shown in FIGS. 9 and 10.

That is, the height of the terminal base 6 in the Z axial direction is reduced. Concretely, the height of the terminal base 6 in the MI sensor element 1 according to the first embodiment is 0.4 mm, whereas the height of the terminal base 6 in the MI sensor element 1 according to the second embodiment is 0.13 mm.

The other parts are similar to those in the first embodiment.

In the terminal base 6, when the terminal mounting surface 61 to which the wire electrode terminals 11 and the coil electrode terminal 12 are mounted can be sufficiently secured, the working-effect of the present invention can be sufficiently obtained. For this reason, the surface 21 of the base body 2 does not have to be a large area unlike the first embodiment. As long as adhesion to the base body 2 is not deteriorated, the terminal base 6 may have various forms in a state where the area of the terminal mounting surface 61 is sufficiently maintained.

That is, besides the above form, for example, the individual terminal bases may be formed correspondingly to the wire electrode terminals 11 and the coil electrode terminals 12, or the terminal base may be formed into a stepped shape.

Comparative Example

Figure 11:
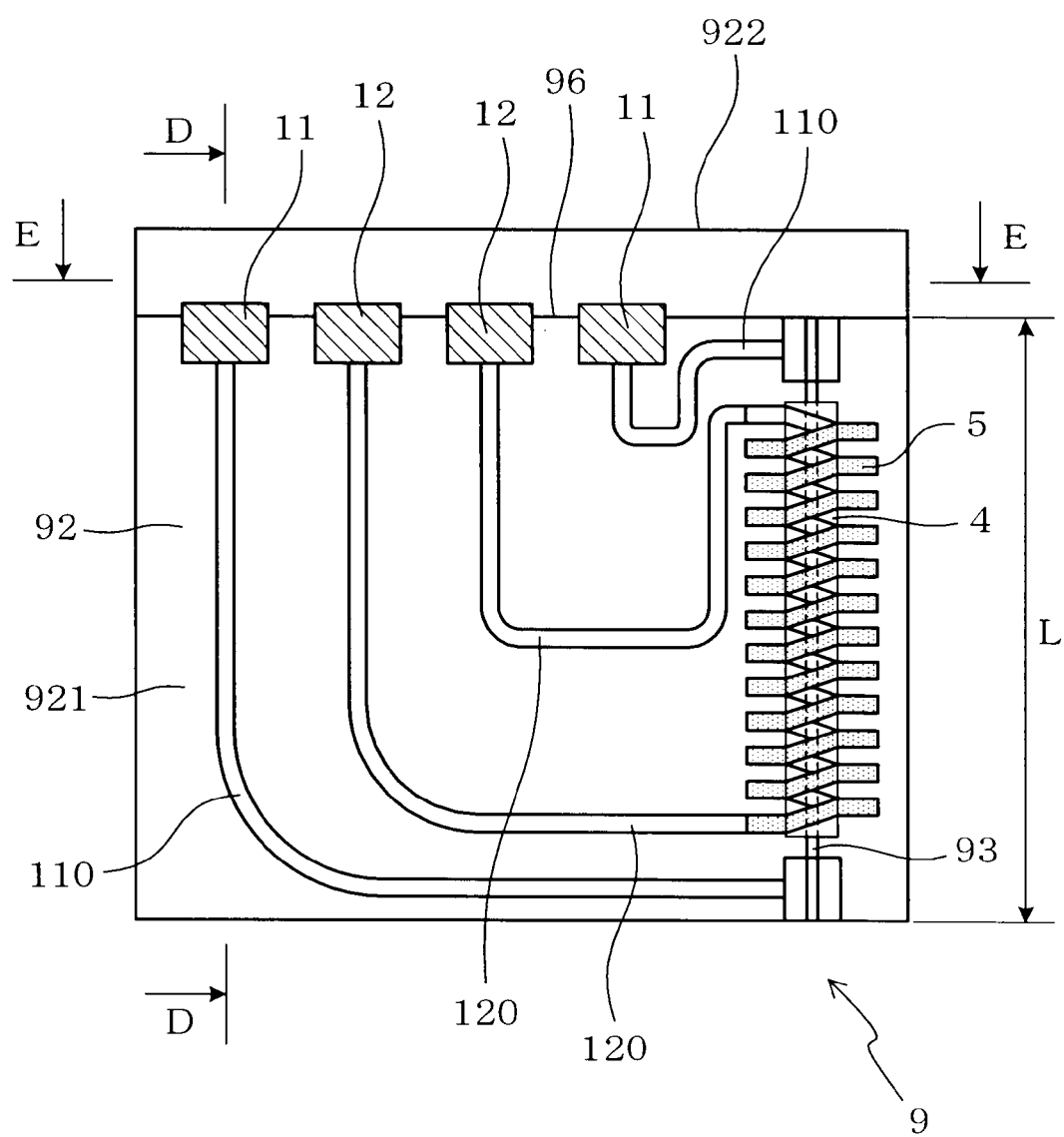
FIG. 11 is an elevational view illustrating the MI sensor element according to a comparative example.
Figure 12:
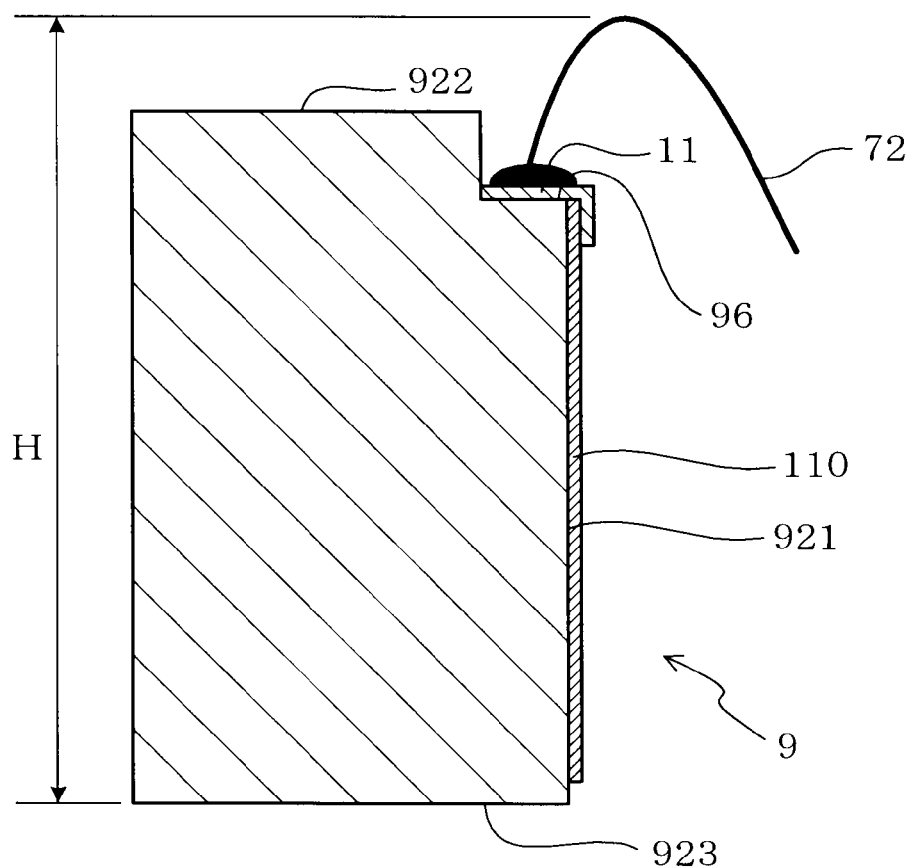
FIG. 12 is a cross-sectional view illustrating the MI sensor element similar to a cross section in the direction of the arrow D-D in FIG. 11 and also illustrating a state that a bonding wire is connected according to the comparative example.
Figure 13:
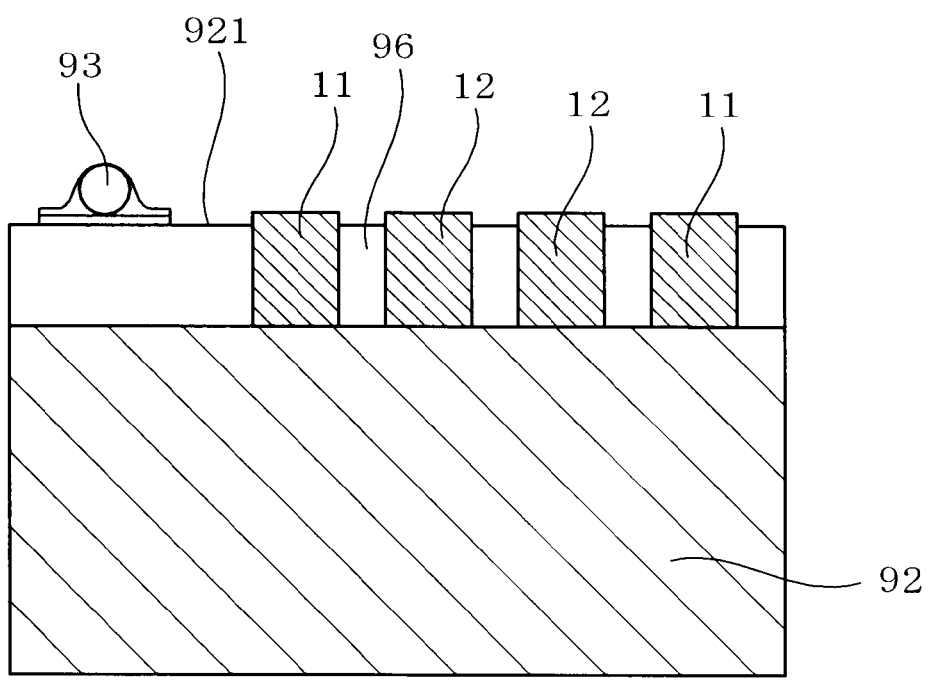
FIG. 13 is a cross-sectional view in the direction of the arrow E-E in FIG. 11.

This example is, as shown in FIGS. 11 to 13, an example of a magneto-impedance sensor element 9 where the wire electrode terminals 11 and the coil electrode terminals 12 are provided directly to a base body 92 without providing the terminal base 6 described in the first and second embodiments.

The MI sensor element 9 of the comparative example is formed so that a magnetic amorphous wire 93, the coating insulator 4, the detecting coil 5, the wire connecting wirings 110 and the coil connecting wirings 120 are formed on a surface 921 of the base body 92 similarly to the first and second embodiments. One end of the magnetic amorphous wire 93 on the base body 92 in the longitudinal direction (Z axial direction) has a stepped portion 96, and the wire electrode terminals 11 and the coil electrode terminals 12 are provided on a surface perpendicular to the Z axial direction.

The stepped portion 96 is formed on the entire surface of the base body 92 in a direction perpendicular to the Z axial direction and a thickness direction (a right-left direction of FIG. 11).

The constitution of the construct composed of the magnetic amorphous wire 93, the coating insulator 4 and the detecting coil 5 is similar to that in the first embodiment, and its size and the number of turns of the detecting coil 5 are also similar.

The stepped portion 96 is necessarily formed, from a viewpoint of the manufacturing, on the MI sensor element 9 for the Z axial direction where the wire electrode terminals 11 and the coil electrode terminals 12 should be formed on the surface perpendicular to the magnetic amorphous wire 3.

Figure 14B:
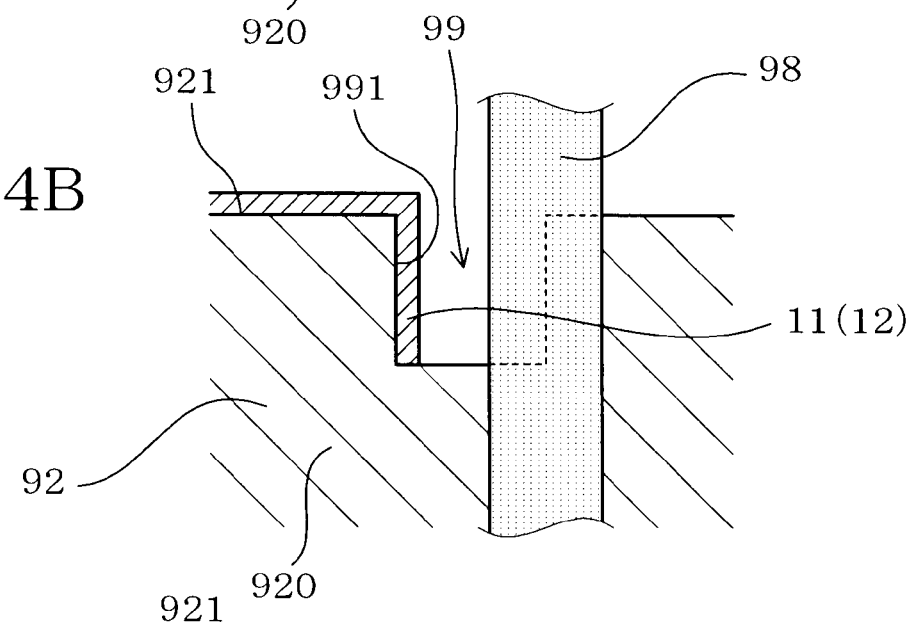

That is, prior to the manufacturing of the MI sensor element 9, as described above, the many MI sensor elements 9 are formed on the base body wafer 920 serving as the basic material of the base bodies 92 of the many MI sensor elements 9. Thereafter, as shown in FIG. 14(B), the base body wafer 920 is cut by a dicing saw 98 into the individual MI sensor elements 9.

A groove 99 is formed along a cutting line, which is to be cut, on the surface of the base body wafer 920 before cutting. That is, for example, the groove 99 having a depth of 200 μm and a width of 200 μm is formed on the base body wafer 920 as shown in FIG. 14A. Thereafter, the wire electrode terminals 11 and the coil electrode terminals 12 are formed on an inside surface 991 of the groove 99 and on the surface 921 of the base body 92 continuous to 991 as a pattern. Cutting is performed by the dicing saw 98 on a portion slightly outer side (for example, 70 μm) with respect to the inside surface 991 of the groove 99. As a result, the wire electrode terminals 11 and the coil electrode terminals 12 can be formed on the inside surface 991 of the groove 99 as a pattern in the state before the cutting.

Figure 14C:
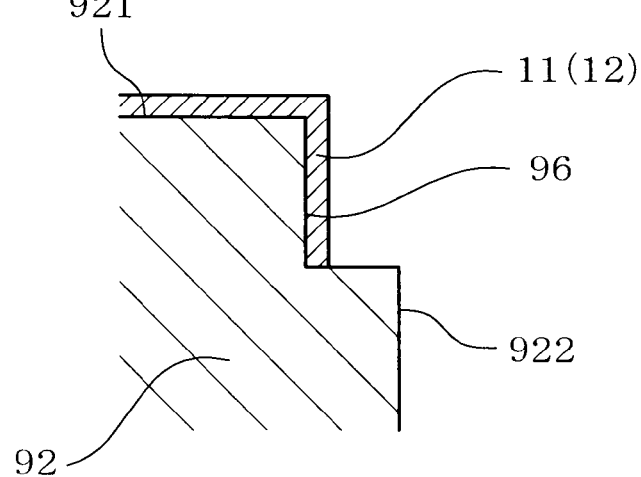

As shown in FIG. 14(C), after the cutting, a part of the groove 99 remains as the above-described stepped portion 96.

The base body wafer 920 is cut after the machining of the groove because integrity of the base body wafer 920 is maintained until the forming of the wire electrode terminals 11 and the coil electrode terminals 12 is completed.

That is, The MI sensor element 9 for the Z axial direction should be provided with the wire electrode terminals 11 and the coil electrode terminals 12 formed on the surface perpendicular to the magnetic amorphous wire 93 as described above. For this reason, the surface perpendicular to the surface 921 of the base body 92 should be formed on the base body 92. For this reason, if the groove is not machined, the wire electrode terminals 11 and the coil electrode terminals 12 cannot be formed on the base body wafer 920. If the groove is not machined, electrode terminals should be formed on the individual cut-off base bodies 2, thereby noticeably deteriorating the productivity. For this reason, the groove is machined so that the electrode terminals can be formed and also the integrity of the base body wafer 920 can be maintained.

However, when the stepped portion 96 that remains as one portion of the groove 99 is present over one end of the base body 92 in the Z axial direction, as shown in FIG. 11, the length of the magnetic amorphous wire 93 should be shorter than the length of the base body 92 in the Z axial direction. For example, when a step difference between an upper end 922 of the base body 92 and the stepped portion 96 is 70 μm, the magnetic amorphous wire 93 is made to be shorter than the base body 92 by 70 μm or more. Further as shown in FIG. 12, when the height of the bonding wires 72 to be connected to the wire electrode terminals 11 and the coil electrode terminals 12 is taken into consideration, a length L of the magnetic amorphous wire 93 (FIG. 11) is significantly shorter than an occupancy height H (FIG. 12) of the MI sensor element 9 in the Z axial direction including the bonding wires 72.

In order to form the stepped portion 96 on the base body 92 so that the wire electrode terminals 11 and the coil electrode terminals 12 are arranged, the groove should be machined. As a result, the manufacturing cost becomes high, and the thickness should be increased in order to secure the strength of the base body 92. A material that is easily machined should be selected as the base body 92 in order to machine the groove on the base body 92, but such a material has weak mechanical strength, and thus the thickness of the base body 92 should be further increased.

As a result, the thickness of the MI sensor element 9 should be increased.

It is difficult to miniaturize the MI sensor element 9 of the comparative example and simultaneously increase the length of the magnetic amorphous wire 3.

On the contrary, in the MI sensor element 1 (the first and third embodiments) of the present invention, as shown in FIGS. 1 and 9, the length of the magnetic amorphous wire 3 can be made to be as long as the length of the base body 2 in the Z axial direction. For this reason, the length of the magnetic amorphous wire 3 is made to be long, and simultaneously the sizes of the MI sensor element 1 can be reduced.

Since the MI sensor element 1 of the present invention does not require the machining of the groove, the thickness of the base body 2 does not have to be large, so the size of the MI sensor element further can be reduced.

Since a position of the terminal mounting surface 61 on the terminal base 6 can be freely set, a distance between the terminal mounting surface 61 and the upper end of the base body 2 in the Z axial direction can be sufficiently large. As a result, as shown in FIG. 2, even when the bonding wires 72 are connected to the wire electrode terminals 11 and the coil electrode terminals 12, upper ends of the bonding wires 72 can be prevented from protruding from the upper end of the base body 2. For this reason, the length of the magnetic amorphous wire 3 can be prevented from being shorter than the occupancy height of the MI sensor element 1 including the bonding wires 72.

A ratio of the occupancy height H of the MI sensor element in the Z axial direction including the bonding wires to the length L of the magnetic amorphous wire (H/L) is used as a size-reduction index $\phi$ of the MI sensor element, and the MI sensor element 1 according to the first embodiment is compared with the MI sensor element 9 of the comparative example. As the size-reduction index $\phi$ is smaller (closer to 1), the size-reduction with an equivalent performance is further achieved.

The size-reduction index $\phi$ of the MI sensor element 9 of the comparative example is calculated.

A height from a lower end 923 of the base body 92 of the MI sensor element 9 in the comparative example in the Z axial direction to the stepped portion 96 is 0.6 mm, and a height from the stepped portion 96 to the upper end 922 is 0.07 mm. A height from the stepped portion 96 to the bonding wires 72 in the Z axial direction is 0.15 mm. For this reason, the occupancy height H of the MI sensor element in the comparative example (FIG. 12) is 0.6 mm+0.15 mm=0.75 mm.

Therefore, the size-reduction index $\phi$ of the MI sensor element in the comparative example is 0.75 mm/0.6 mm=1.25.

On the other hand, in the MI sensor element 1 according to the first embodiment, as shown in FIG. 2, the bonding wires 72 are positioned below the upper end 22 of the base body 2. For this reason, even when the bonding wires are included, the occupancy height H (FIG. 1) in the Z axial direction corresponds to the height of the base body 2 in the Z axial direction and is 0.6 mm. Since the magnetic amorphous wire 3 is formed over the entire length of the base body 2 in the Z axial direction, its length L is 0.6 mm.

Therefore, the size-reduction index $\phi$ of the MI sensor element according to the first embodiment is 0.6 mm/0.6 mm=1.

That is, the MI sensor element according to the first embodiment realizes the size-reduction of 20% in the Z axial direction with respect to the MI sensor element of the comparative example. That is, the length of the magnetic amorphous wire, namely, the magnetic sensitivity is maintained, and simultaneously the size-reduction of 20% in the Z axial direction can be realized.

When a connecting method used besides the bonding wires (for example, solder connection) is adopted, the height of the bonding wires does not have to be taken into consideration. However, in this case, the MI sensor element 1 according to the first embodiment is smaller than the MI sensor element 9 of the comparative example.

That is, in this case, the size-reduction index $\phi$ of the MI sensor element 9 of the comparative example is 0.67 mm/0.6 mm≈1.12, and the size-reduction index $\phi$ of the MI sensor element 1 according to the first embodiment is 0.6 mm/0.6 mm=1. For this reason, also in this case, the size-reduction of about 10% can be realized.

Since the MI sensor element 9 of the comparative example requires the groove machining as described above, ceramics having weak strength that can be easily cut is used as a material of the base body 92. For this reason, its thickness (the thickness of the base body 92 in a direction perpendicular to the surface 921 where the magnetic amorphous wire 93 is arranged) is set to as thick as 0.5 mm.

On the contrary, in the MI sensor element 1 according to the first embodiment, since the groove machining does not have to be taken into consideration, ceramics having high strength is used, and the thickness of the base body 2 is set to 0.3 mm. Even when the thickness (0.1 mm) of the terminal base 6 is added, the thickness of the MI sensor element 1 becomes 0.4 mm. That is, also the thickness of the MI sensor element according to the first embodiment can be thinner than that in the comparative example.

Such a difference between the first embodiment and the comparative example is also present between the second embodiment and the comparative example.

Even if the wire electrode terminals 11 and the coil electrode terminals 12 can be formed without the grove machining in the comparative example, in order to perform the wire bonding, the size-reduction index $\phi$ of the MI sensor element as the ratio (H/L) of the occupancy height H of the MI sensor element in the Z axial direction including the bonding wires to the length L of the magnetic amorphous wire finally becomes large. That is, in this case, when the length L of the magnetic amorphous wire is 0.60 mm, the occupancy height H of the MI sensor element in the Z axial direction including the bonding wires becomes as long as 0.75 mm. For this reason, the size-reduction index $\phi$ becomes 0.75 mm/0.60 mm=1.25, and thus it is larger than $\phi$=1 in the first embodiment. That is, even in comparison with this case, the size of the MI sensor element of the present invention can be reduced with the same performance level maintained.

The invention claimed is:

1. A magneto-impedance sensor element, comprising:
   a base body made of a nonmagnetic body;
   a magnetic amorphous wire held on the base body;
   a coating insulator formed so that the magnetic amorphous wire passes through its inside;
   a detecting coil formed around the coating insulator;
   a terminal base made of an insulator having a terminal mounting surface raised from a surface of the base body on a side where the magnetic amorphous wire is arranged;
   wire electrode terminals and coil electrode terminals formed over the terminal mounting surface;
   wire connecting wirings for electrically connecting the wire electrode terminals and a pair of wire conducting terminals provided to the magnetic amorphous wire; and
   coil connecting wirings for electrically connecting the coil electrode terminals and a pair of coil conducting terminals provided to the detecting coil, wherein the wire electrode terminal and the coil electrode terminal are configured to connect respective ends of a bonding wire, and a normal of the terminal mounting surface is aligned with a longitudinal direction component of the amorphous wire, and the terminal mounting surface is arranged between both ends of the magnetic amorphous wire in the longitudinal direction of the magnetic amorphous wire.

2. The magneto-impedance sensor element according to claim 1, wherein the terminal mounting surface is formed so that the normal is in the longitudinal direction of the magnetic amorphous wire.

3. The magneto-impedance sensor element according to claim 1, wherein the terminal base is formed on an area other than the area where the magnetic amorphous wire, the coating insulator and the detecting coil are formed.

4. The magneto-impedance sensor element according to claim 1, wherein the magneto-impedance sensor element is an element to be packaged to an IC chip with an electronic circuit formed, so that the longitudinal direction of the magnetic amorphous wire is conformed to a normal direction of a main surface of the IC chip.

5. The magneto-impedance sensor element according to claim 1, wherein the element is packaged to an IC substrate provided with an IC chip mounted thereon and with an electronic circuit formed, so that the longitudinal direction of the magnetic amorphous wire is conformed to a normal direction of a main surface of the IC substrate.

6. The magneto-impedance sensor element according to claim 1, wherein a length of the magnetic amorphous wire is substantially equal to a length of the side of the base body where the magnetic amorphous wire is arranged.

7. The magneto-impedance sensor element according to claim 4, wherein the terminal mounting surface is parallel to the main surface of the IC chip.

* * * * *